United States Patent [19]

Poldy et al.

[11] Patent Number: 4,589,136
[45] Date of Patent: May 13, 1986

[54] CIRCUIT FOR SUPPRESSING AMPLITUDE PEAKS CAUSED BY STOP CONSONANTS IN AN ELECTROACOUSTIC TRANSMISSION SYSTEM

[75] Inventors: Carlo Poldy; Gebhard Hopfmüller, both of Vienna, Austria

[73] Assignee: AKG Akustische u.Kino-Geräte GmbH, Austria

[21] Appl. No.: 684,025

[22] Filed: Dec. 20, 1984

[30] Foreign Application Priority Data

Dec. 22, 1983 [AT] Austria ................. 4486/83

[51] Int. Cl.$^4$ ........................... H04R 25/00
[52] U.S. Cl. ...................... 381/94; 381/71; 381/112
[58] Field of Search .......... 381/94, 110, 111, 112–115, 381/122, 123, 98, 70, 71, 72

[56] References Cited

U.S. PATENT DOCUMENTS 4,409,435 11/1983 Ono ........................... 381/71

FOREIGN PATENT DOCUMENTS 2101458 1/1983 United Kingdom ............ 381/71

Primary Examiner—Gene Z. Rubinson
Assistant Examiner—L. C. Schroeder
Attorney, Agent, or Firm—McGlew and Tuttle

[57] ABSTRACT

A circuit in an electroacoustic transmission system suppresses amplitude peaks which are caused by the utterance of a stop consonant such as a "P". A microphone of the transmission system has an output which a high-pass filter is connected. The high-pass filter is normally inactive but can be activated by an electronic switch for a brief period of time. The switch is controlled by a train of electronic elements functioning as a detector for detecting a characteristic quiescent or pause period before the explosive discharge of the stop consonant. Upon detecting this pause the electronic switch is activated and held activated for about 10 to 30 ms. During that time the peak occurs but is suppressed in that it is not passed by the high-pass filter which is activated during this time.

15 Claims, 5 Drawing Figures

CIRCUIT FOR SUPPRESSING AMPLITUDE PEAKS CAUSED BY STOP CONSONANTS IN AN ELECTROACOUSTIC TRANSMISSION SYSTEM

FIELD AND BACKGROUND OF THE INVENTION

The present invention relates in general to sound transmitting equipment, and in particular to a new and useful arrangement for suppressing amplitude peaks in an electroacoustic transmission system, which peaks are caused by spoken stop consonants.

In voice transmission, microphones are generally troubled by those consonants which are formed by a so-called explosion in the articulation, i.e. a sudden release of impounded breath. Such consonants, called stop consonants or stops, comprise the sounds B,D,T and quite particularly P. Upon exposing a microphone to sound from a distance of about 1 cm up to 12 cm in front of the mouth and without providing a satisfactory sound pickup protection, the microphone will always tend to reproduce the stop consonants in a distorted and overaccentuated way. This phenomenon is termed "pop noise", with the pop signal itself being produced predominantly by low-frequency oscillations up to 300 Hz.

Attempts have repeatedly been made to design a microphone wind guard so as to make the pop noise substantially inaudible. Such microphones protected against wind and blow are disclosed in U.S. Pat. No. 4,263,484, German AS No. 17 62 944 and German OS No. 15 62 210. However, these disclosures do not teach how, and to what extent, the wind guard influences the pop of the microphone. Particularly, only mechanical acoustic remedies are provided.

It is known from speech and word formation analyses that while forming a stop, such as P or T, a pause of about 100 ms precedes the following explosive start of the consonant, which pause is a period of quiescence. Details in this regard may be found in the periodical *Acustica*, Vol. 43, pages 167 to 173, and in the 11th *ICA Report*, Paris 1983, pages 205 to 208.

SUMMARY OF THE INVENTION

The present invention is directed to the elimination of so-called "pops" while avoiding mechanical acoustic elements as far as possible, and to an electronic arrangement for this purpose, being connected between the microphone and the microphone amplifier and permitting at relatively low costs an inconspicuous, noiseless suppression of such noises.

The invention starts from the consideration that in general, the pop noise frequencies do not exceed 500 Hz and that, consequently, such noise can be suppressed by means of a high-pass filter which remains connected in the transmission path only for the duration of the peak values of the pop signal. To control the effect of the high-pass filter, the appearance of the pause of about 100 ms immediately before the formation of the stop consonant is utilized, and the high-pass filter is connected just during this period of time. More particularly, according to the inventive design, a high-pass following the microphone is associated with an electronic switch which is controllable by a voltage derived from the microphone through an electronic train and has a self-locking time of about 10 to 30 ms during which the electronic switch provides an electrical connection making the high-pass filter operative.

The invention is advantageous primarily in that the pop noises are cut out of the transmission path without producing any other noise instead. The invention can by no means be compared to amplitude clippers which reduce the dynamics of the transmission and may also lead to distortions and, mainly, become effective only after the amplitude peaks have already occurred. In contradistinction thereto, the inventive high-pass filter is connected into the path prior to the occurrence of the stop, namely within the preceding period of quiescence, and remains effective for about 10 ms to 30 ms, depending on the adjustment, during the time in which the large amplitudes caused by the stop are produced. After this time, the high-pass filter is automatically and smoothly switched off, since then the pop signal has already faded out to an extent requiring no further filtering. In contradistinction thereto, none of the measures hitherto attempted with acoustic filters were absolutely effective, since both the position of the microphone relative to the mouth and the individual formation of the stop consonant by the speaker or singer determine a stronger or weaker effect of the acoustic filter.

In an advantageous embodiment of the invention it is provided that a control voltage derived from the microphone for the electronic switch is directed through an electronic train which is effective as a detector and comprises a first amplifier, a high-pass filter, a second amplifier, a signal rectifier, and a comparator. The electronic switch is connected to the comparator by its control input, and the comparator is supplied with a reference voltage.

The purpose of the detector is to recognize the no-signal pauses and, after a waiting time of 7 ms, to actuate the electronic switch and thus connect the high-pass filter into the transmission path between the microphone and the microphone amplifier. If then an audio signal occurs, and due to the recognition of this signal by the detector, the high-pass filter is smoothly switched off by the controlled electronic switch after a locking time of 10 to 30 ms.

It is advantageous for a quite satisfactory function of the inventive arrangement to provide a cutoff frequency of about 500 Hz for both the high-pass filter connected in the transmission path and the high-pass filter forming a part of the electronic train to the electronic switch. The detector formed by the train leading to the electronic switch must be protected against overdriving audio frequency amplitudes, which may be done very simply by means of a high-pass filter comprising two passive elements. Since the high amplitude peaks known as pop noise occur in the lowest frequency range, it is advisable to provide the limit or cutoff frequencies of the two high-pass filters either equal to each other, or at least in the region of 500 Hz.

The inventive design may be such that the high-pass filter connected in the transmission path comprises a half section which is formed by a coupling capacitor and an inductance and connected between the microphone and the active section of the electronic switch formed by a field effect transistor, with the junction between the coupling capacitor and the inductance being applied to the input of a following amplifier for amplifying the microphone signal. The half section forming the high-pass filter is the simplest arrangement of at least two passive component parts, with one of them, namely the capacitor, being used for two functions, i.e. also as a coupling or separating capacitor between the microphone and the microphone amplifier.

Accordingly an object of the present invention is to provide an arrangement for suppressing amplitude peaks caused by stop consonants in an electroacoustic transmission system having a microphone at its input, comprising a high-pass filter following the microphone in a transmission path, an electronic switch connected to the high-pass filter which is controllable by a voltage derived from the microphone to activate the high-pass filter, the voltage being derived from a train of electronic elements which detect a characteristic cause before the stop consonant peak, the electronic switch having a self-lock time of about 10 to 30 ms during which the high-pass filter is effective.

A further object of the invention is to provide an arrangement for suppressing amplitude peaks caused by stop consonants which is simple in design rugged in construction and economical to manufacture.

A still further object of the invention is to provide a method of suppressing amplitude peaks which includes activating a high-pass filter after a characteristic delay before the stop consonant is detected, the high-pass filter being connected to an output of the microphone and being activated by a switch which is self-locking for a selected time period and which is activated by a detection of the characteristic pause.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

Further details of the invention may be learned from the following description referring to the drawings in which.

DESCRIPTION OF THE PREFERRED EMBODIMENTS

Figure 1:
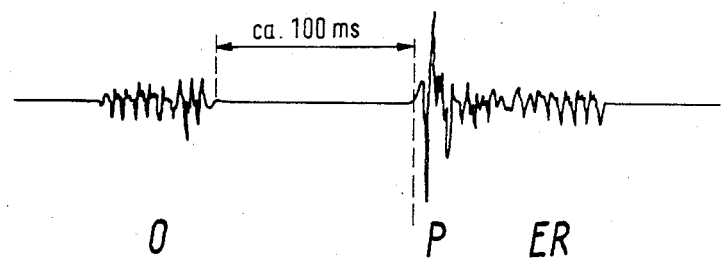
FIG. 1 shows an oscillogram of the word or word segment "oper" (which means opera in German)
Figure 2:
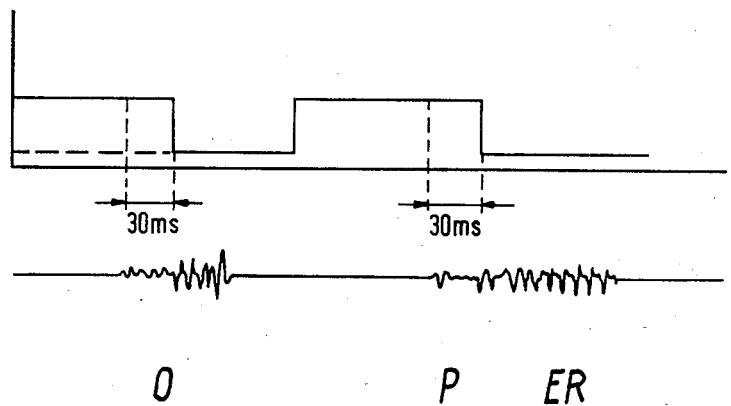
FIG. 2 shows the switching on and off operation of a high-pass filter in time, in association with the word "oper" and the supression of the pop signal occurring therein.

The oscillogram of FIG. 1 shows that the vocal "o" is followed by a pause of about 100 ms, and that only thereafter the stop consonant "p" occurs. This is followed by the "er" sound to complete the word "oper". The period of quiescence is needed for building up the stop and it has an almost identical duration for all stops in any known or imaginable word. To produce the excess pressure in the mouth necessary to form the stop, the lips must be closed immediately before, which produces the pause quite automatically. The explosive rise of the amplitude of the stop P is determining for the pop noise produced by the microphone. FIG. 2 illustrates the switching on and off of a high-pass filter in association with the oscillogram of the voiced word "oper", including the filtered stop P. The filter operates in a way such that, for example, 30 ms after the very start of the stop consonant, the filter is switched off. To keep intact the acoustic impression the spoken or sung word produces on the listener, and also make the switching off of the filter inaudible, it is advisable to select a switch-off time between 10 ms and 30 ms at most. The annoying pop noise remains cut out and cannot be heard.

Figure 3:
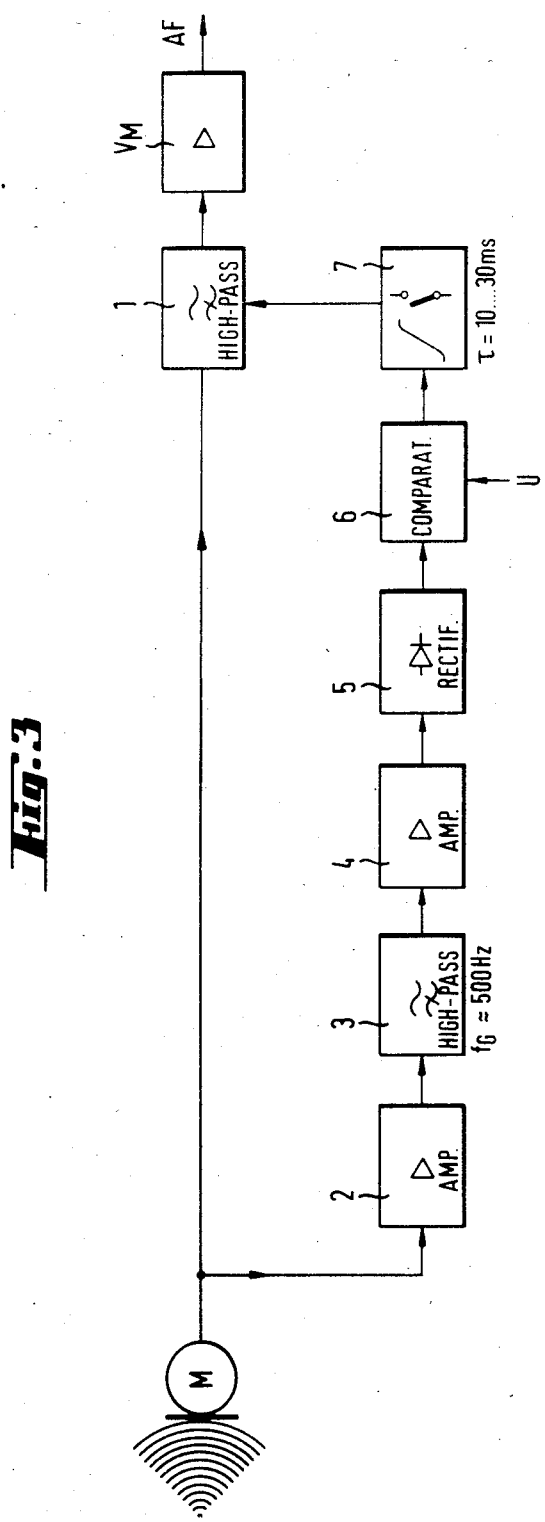
FIG. 3 is a block diagram of the inventive arrangement.

The block diagram of FIG. 3 is to explain the function of the high-pass filter. Be it assumed that an electrical audio frequency signal analog to the picked up acoustic signal is available at the output of microphone M. In the transmission path between microphone M and microphone amplifier $V_M$, a high-pass filter 1 is provided which is switched on or off depending on the audio frequency signal, whereupon, if switched on, filter 1 remains in this state for a period of time of 10 to 30 ms. Filter 1 is switched on or off by means of a train of electronic component parts comprising a first amplifier stage 2, a high-pass filter 3, a second amplifier stage 4, a signal rectifier 5, and a comparator 6 to which a time delay switching stage 7 is connected. Amplifier stages 2 and 4 correspondingly amplify the audio frequency signal present at the microphone output. Frequencies below about 500 Hz contained in this signal are suppressed in high-pass filter 3, and do not pass to amplifier stage 4. In signal rectifier 5, the audio frequency signal is rectified and supplied as a d.c. voltage signal to comparator 6. As soon as this d.c. voltage exceeds a constant reference voltage U supplied to the comparator, the following integrator 7 having a time constant $\tau = 10$ ms to 30 ms becomes effective. After the expiration of a time period between 10 ms and 30 ms, high-pass filter 1 is switched off by stage 7 through a field effect transistor acting as a switching transistor, so that now even frequencies below 500 Hz of the audio frequency signal again reach the amplifier. Should no audio frequency signal be applied, high-pass filter 1 switches on after about 7 ms.

Figure 4:
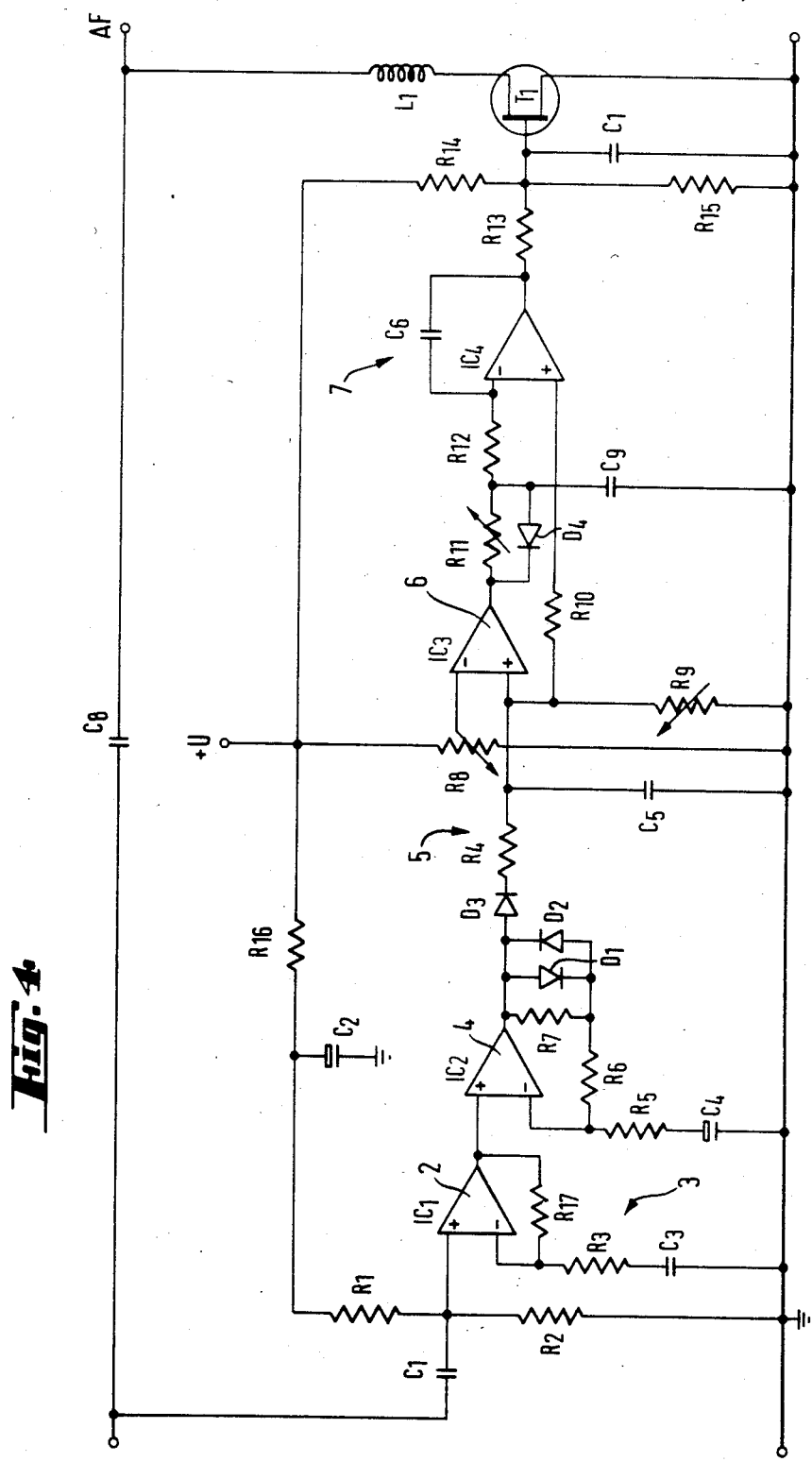
FIG. 4 shows a circuit embodying the invention.

The inventive circuitry corresponding to the block diagram in FIG. 3 may be learned from FIG. 4. Integrated circuits $IC_1$ and $IC_2$ correspond to amplifier stages 2 and 4 of FIG. 3, with stage 2 having a gain of 40 db and stage 4 a gain of 26 db. The RC combination comprising a resistor $R_3$ and a capacitor $C_3$ corresponds to a high-pass filter 3 having a cutoff frequency of about 500 Hz. Signal rectifier 5 is formed in the embodiment of FIG. 4 by a diode $D_3$, and a low-pass filter $R_4$ and $C_5$. Comparator 6 is formed by an integrator circuit $IC_3$ and compares the positive voltage adjusted at a control resistor $R_8$ and applied to the inverting input of circuit $IC_3$, with the rectified audio frequency signal voltage from rectifier $D_3$, $R_4$, $C_5$ applied to the non-inverting input of circuit $IC_3$. As soon as the voltage of the rectifier exceeds the voltage from control resistor $R_8$, a positive voltage appears at the output of integrated circuit $IC_3$. In such an instance, diode $D_4$ is operated in the reverse direction and the RC combination of a control resistor $R_{11}$ and a capacitor $C_9$ becomes effective. This means that within the time period of 10 to 30 ms and in accordance with the resistance adjusted at control resistor $R_{11}$, a positive voltage is applied to the inverting input of an integrated circuit $IC_4$ operating as an integrator, which positive voltage depends on the time constant of the integrator and produces a zero potential at the output thereof. Field effect transistor $T_1$ effective as a switching transistor is thereby blocked and makes inductance $L_1$ ineffective, which means that the high-pass filter formed by inductance $L_1$ and coupling capacitor $C_8$ is inoperative.

During the pause for building up a stop consonant, no audio frequency voltage is present, and then the circuit operation is such that field effect transistor $T_1$ makes the high-pass filter formed by inductance $L_1$ and coupling capacitor $C_8$ effective. Both the switching on and switching off of the high-pass filter is "smooth" i.e. without an audible click, if the integration constant of the integrator is correctly selected. The switching on of the high-pass filter within 7 ms after an interruption of an audio frequency signal, is determined by the time constant of the RC section formed by resistor $R_4$ and capacitor $C_5$. The audio frequency voltage (AF) to be supplied to the following amplifier is present at the junction between $L_1$ and $C_8$. The other end of coupling capacitor $C_8$ is applied to the microphone output. The high-pass filter shown in this embodiment is the most simple form of such a filter, of course. More complicated forms may be provided without departing from the scope of the invention. This is only a question of costs and the requirements on the properties of the filter.

Figure 5:
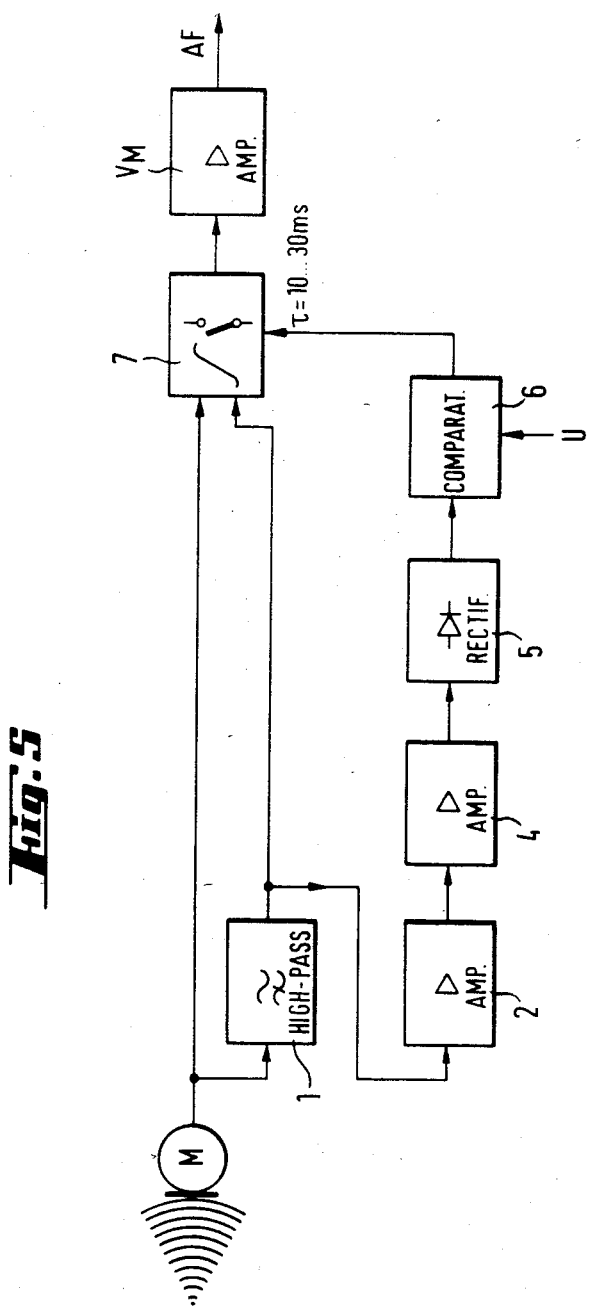
FIG. 5 is a block diagram of another inventive arrangement.

FIG. 5 is a block diagram of another embodiment, very similar to that of FIG. 3. The high-pass filter 1 connected in the transmission path between microphone M and microphone amplifier $V_M$ is utilized for two purposes, namely as a filter in the transmission path, for suppressing the amplitude peaks at the start of stop consonants, and as a high-pass filter (designated 3 in FIG. 3) and forming a part of the electronic train effective as a detector, to clip the amplitude of all signals below about 500 Hz. Otherwise, the circuit arrangement according to FIG. 3 is maintained and need not be described in this connection.

While specific embodiments of the invention have been shown and described in detail to illustrate the application of the principles of the invention, it will be understood that the invention may be embodied otherwise without departing from such principles.

What is claimed is:

1. An apparatus for suppressing amplitude peaks in an electroacoustic transmission system having a transmission path with a microphone therein, which peaks are caused by stop consonants being sounded into the microphone, there being a characteristic pause before each peak, comprising:
    a high-pass filter connected to the microphone in the transmission path for receiving an audio signal from the microphone;
    an electronic switch associated with the high-pass filter and activatable to cause the high-pass filter to pass only high frequency portions of the audio signal from the microphone, said electronic switch having a control port for receiving an activating signal, said electronic switch having a self-locking time for continuing the activation of said high-pass filter which is sufficiently long to suppress an amplitude peak of a stop consonant; and
    circuit means connected to said microphone and to said electronic switch control port for generating the activating signal as a function of the audio signal from the microphone.

2. An apparatus according to claim 1, wherein said circuit means comprises a detector for detecting the pause before a peak and for generating the activating signal upon detecting the pause.

3. An apparatus according to claim 2, wherein said detector comprises a first amplifier connected to said microphone, a further high-pass filter connected to said first amplifier, a second amplifier connected to said further high-pass filter, a signal rectifier connected to said second amplifier, and a comparator for comparing an output of said signal rectifier with a reference voltage, said comparator having an output connected to said control port of said electronic switch.

4. An apparatus according to claim 3, wherein said first mentioned and further high-pass filter each pass frequencies of about 500 Hz and greater, said passing frequency of said first mentioned high-pass filter being substantially equal to said passing frequency of said further high-pass filter.

5. An apparatus according to claim 1, wherein said high-pass filter is activatable to pass frequencies of only about 500 Hz and above, said self-lock time being from about 10 to about 30 ms.

6. An apparatus according to claim 5, wherein said electronic switch is connected in the transmission path, an audio amplifier at an output of said electronic switch, said circuit means comprising an amplifier connected to an output of said high-pass filter, a signal rectifier connected to said amplifier and a comparator connected to said rectifier for comparing an output of said rectifier with a reference voltage, said comparator connected to said control port of said electronic switch and said output of said high-pass filter connected to an input of said electronic switch, said amplifier, rectifier and comparator acting as a detector for detecting the pause before a peak and for generating the activating signal when the pause is detected.

7. An apparatus according to claim 1, wherein said high-pass filter comprises a capacitor connected in series with said microphone, and an inductor connected in parallel with said microphone and having a junction connection with said capacitor, said circuit means connected in parallel with said capacitor, said electronic switch including a field effect transistor having an input and an output connected in series with said inductor and a base forming said control port, an audio signal of said microphone being available at said junction for amplification by an audio-frequency amplifier.

8. An arrangement for suppressing amplitude peaks caused by stop consonants having a quiescent period and a peak period and uttered into an electroacoustic transmission system having a transmission path with a microphone having an output characterized in that a high-pass filter (1) following the microphone (M) output in the transmission path is associated with an electronic switch (7) which is controllable by a voltage derived from the microphone (M) through a train of electronic elements, the switch being a self-locking time of about 10 to 30 ms during which time the electronic switch forms a connection making the high-pass filter (1) effective.

9. An arrangement according to claim 8, characterized in that the voltage derived from the microphone for controlling the electronic switch (7) is applied through the train of electronic elements which is effective as a detector of the quiescent period and comprises a first amplifier (2), a further high-pass filter (3), a second amplifier (4), a signal rectifier (5), and a comparator (6) to which a control input of the electronic switch (7) is connected and a reference voltage (U) is applied.

10. An arrangement according to claim 8, characterized in that the cutoff frequency of the high-pass filter (1) following the microphone (M) in the transmission path is about 500 Hz or less.

11. An arrangement according to claim 9. characterized in that the cutoff frequency of a high-pass filter (3) belonging to the train of electronic elements is 500 Hz or less, and substantially equals that of the high-pass filter (1) connected in the transmission path.

12. An arrangement according to claim 8, characterized in that the high-pass filter (1) provided in the transmission path comprises a half section which is formed by a coupling capacitor ($C_8$) and an inductance ($L_1$) and is connected between the microphone M and an active part formed by a field effect transistor ($T_1$) of the electronic switch (7), and that a junction (AF) between the coupling capacitor ($C_8$) and the inductance ($L_1$) is connected to an input of a following audio-frequency amplifier ($V_M$)

13. A method of suppressing amplitude peaks in an electroacoustic tranmission system having a transmission path with a microphone therein, which peaks are caused by stop consonants being sounded into the microphone and having a pause before each peak, comprising:

detecting the occurrence of a pause before a peak; and passing only a high frequency portion of a signal from the microphone on the transmission path for a selected period of time after the detection of the pause, after which all of the signal from the microphone is passed on a transmission path.

14. A method according to claim 13, including passing only the high frequency portion of the signal from the microphone for a period of from 10 to 30 ms after a pause is detected.

15. A method according to claim 14, including passing only frequencies above about 500 Hz for the selected period after the pause has been detected.

* * * * *